(12) United States Patent
Her et al.

(10) Patent No.: US 12,315,582 B2
(45) Date of Patent: May 27, 2025

(54) MEMORY DEVICE AND OPERATING METHOD OF THE MEMORY DEVICE

(71) Applicant: SK hynix Inc., Icheon-si (KR)

(72) Inventors: Min Ho Her, Icheon-si (KR); Seung Il Kim, Icheon-si (KR); Jae Min Lee, Icheon-si (KR); Myoung Kyun Kim, Icheon-si (KR); Won Gyu Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 338 days.

(21) Appl. No.: 17/507,410

(22) Filed: Oct. 21, 2021

(65) Prior Publication Data
US 2022/0351798 A1 Nov. 3, 2022

(30) Foreign Application Priority Data

May 3, 2021 (KR) .................... 10-2021-0057510

(51) Int. Cl.
*G11C 16/04* (2006.01)
*G11C 16/08* (2006.01)
*G11C 16/10* (2006.01)
*G11C 16/26* (2006.01)
*G11C 29/12* (2006.01)
*G11C 29/42* (2006.01)

(52) U.S. Cl.
CPC .............. *G11C 29/42* (2013.01); *G11C 16/08* (2013.01); *G11C 16/102* (2013.01); *G11C 16/26* (2013.01); *G11C 29/12005* (2013.01)

(58) Field of Classification Search
CPC ....... G11C 29/42; G11C 16/08; G11C 16/102; G11C 16/26; G11C 29/12005; G11C 2029/0411; G11C 11/5628; G11C 11/5642; G11C 16/10; G11C 16/0483; G11C 16/32; G11C 16/3459; Y02D 10/00
USPC ..................................................... 365/185.09
See application file for complete search history.

(56) References Cited

U.S. PATENT DOCUMENTS

2014/0237165 A1* 8/2014 Seo ................... G06F 12/0246
 711/103
2019/0179743 A1* 6/2019 Kim .................. G06F 11/1048
2021/0265004 A1* 8/2021 You ..................... G11C 29/20

FOREIGN PATENT DOCUMENTS

KR 1020170065969 A 6/2017

OTHER PUBLICATIONS

IEEE Transactions on Computer-Aided Design of Integrated Circuits and Systems, vol. 35, No. 7, Jul. 2016 (Year: 2016).*

* cited by examiner

*Primary Examiner* — Tha-O H Bui
(74) *Attorney, Agent, or Firm* — WILLIAM PARK & ASSOCIATES LTD.

(57) ABSTRACT

A memory device configured to select a page having a probability that uncorrectable error correction codes (UECC) will occur by comparing a reference current with a sensing current, and configured to perform a read reclaim operation or an additional pulse applying operation on the corresponding page according to the comparison.

6 Claims, 15 Drawing Sheets

| L_REF | | |
|---|---|---|
| R1 | R2 | R3 |
| 25 | 50 | 75 |

FIG. 11

| L_REF | L_SENSING | ST_NUM |
|---|---|---|
| 50 | 42 | -4 |
| | 43 | -3 |
| | 44 | -2 |
| | 45 | -1 |
| | 46-54 | 0 |
| | 55 | 1 |
| | 56 | 2 |
| | 57 | 3 |
| | 58 | 4 |

FIG. 12

| ST_NUM | Vread | VPULSE |
|---|---|---|
| -4 | R28 | - |
| -3 | R27 | - |
| -2 | R26 | - |
| -1 | R25 | - |
| 0 | - | V_ADD |
| 1 | R24 | - |
| 2 | R23 | - |
| 3 | R22 | - |
| 4 | R21 | - |

MEMORY DEVICE AND OPERATING METHOD OF THE MEMORY DEVICE

CROSS-REFERENCE TO RELATED APPLICATION

The present application claims priority under 35 U.S.C. § 119(a) to Korean patent application number 10-2021-0057510 filed on May 3, 2021, in the Korean Intellectual Property Office, the entire disclosure of which is incorporated by reference herein.

BACKGROUND

1. Technical Field

The present disclosure generally relates to an electronic device, and more particularly, to a memory device and an operating method of the memory device.

2. Related Art

A storage device is a device configured to store data under the control of a host device such as a computer, a smart phone or a smart pad. The storage device includes a device configured to store data on a magnetic disk, such as a Hard Disk Drive (HDD), and a device configured to store data in a semiconductor memory, particularly, a nonvolatile memory, such as a Solid State Drive (SSD) or a memory card.

The storage device may include a memory device configured to store data and a memory controller configured to control the memory device. The memory device is classified into a volatile memory device and a nonvolatile memory device. The nonvolatile memory device includes a Read Only Memory (ROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like.

SUMMARY

In accordance with an aspect of the present disclosure, there may be provided a memory device including: a plurality of pages each configured with a plurality of memory cells; a plurality of page buffers coupled to the plurality of pages through a plurality of bit lines; a peripheral circuit configured to perform a background media scan on a selected page among the plurality of pages at an idle time at which no command is received from a memory controller; a current sensing unit including a plurality of transistors respectively coupled between the plurality of page buffers and memory cells of the selected page, the current sensing unit sensing a current flowing during the background media scan; a string determiner configured to determine a string number, based on a result obtained by comparing a sensing current sensed by the current sensing unit with a reference current; and a read reclaim controller configured to control the peripheral circuit to perform a read reclaim operation or an additional pulse applying operation on a memory block including the selected page according to the string number.

In accordance with another aspect of the present disclosure, there may be provided a method for operating a memory device including a plurality of pages each configured with a plurality of memory cells, the method including: performing a background media scan on a selected page among the plurality of pages at an idle time at which no command is not received from a memory controller; sensing a current flowing through a plurality of transistors respectively coupled between a plurality of page buffers coupled to the plurality of pages through a plurality of bit lines and memory cells of the selected page, in the background media scan; determining a string number, based on a result obtained by comparing a sensing current obtained by sensing a current flowing through the plurality of transistors with a reference current; and performing a read reclaim operation or an additional pulse applying operation on a memory block including the selected page according to the string number.

BRIEF DESCRIPTION OF THE DRAWINGS

Examples of embodiments will now be described more fully hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 11 illustrates a string number determined based on a reference current and a sensing current.

FIG. 12 is a diagram illustrating a method for performing a read reclaim operation and an additional pulse applying operation according to the string number shown in FIG. 11.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Embodiments may provide a memory device for performing a read reclaim or additional pulse applying operation, based on a result obtained by comparing a reference current with a sensing current, and an operating method of the memory device.

Figure 1:
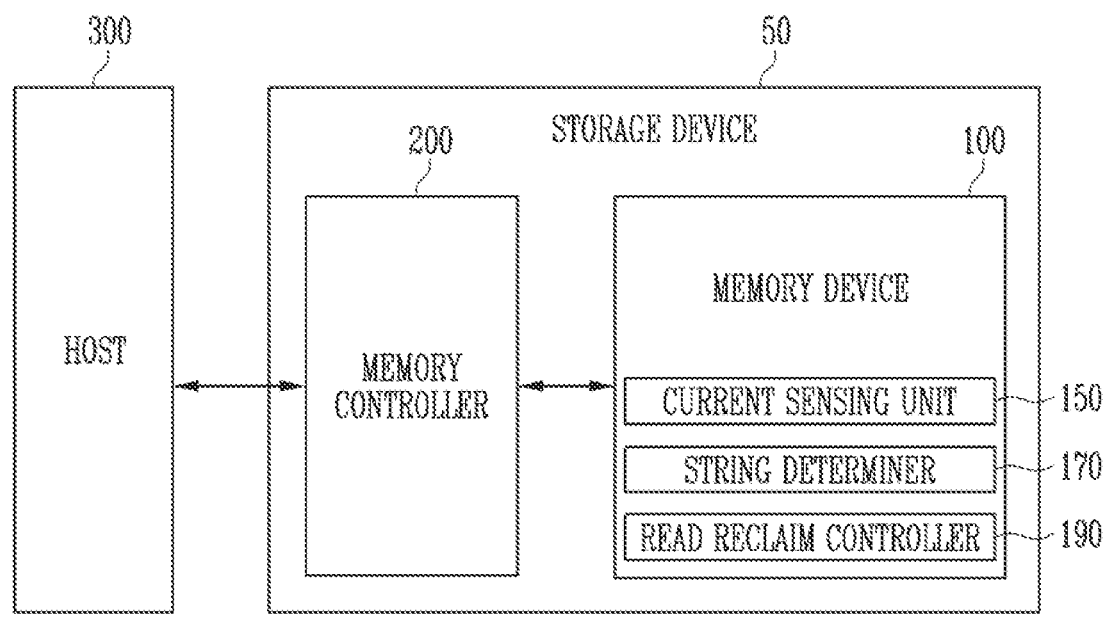
FIG. 1 is a block diagram illustrating a storage device.

FIG. 1 is a block diagram illustrating a storage device.

Referring to FIG. 1, the storage device 50 may include a memory device 100 and a memory controller 200.

The storage device 50 may be a device for storing data under the control of a host 300, such as a mobile phone, a smart phone, an MP3 player, a laptop computer, a desktop computer, a game console, a TV, a tablet PC or an in-vehicle infotainment.

The storage device 50 may be manufactured as any one of various types of storage devices according to a host interface that is a communication scheme with the host 300. For example, the storage device 50 may be implemented with any one of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The storage device 50 may be manufactured as any one of various kinds of package types. For example, the storage device 50 may be manufactured as any one of various kinds of package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data. The memory device 100 operates under the control of the memory controller 200. The memory device 100 may include a memory cell array including a plurality of memory cells for storing data. The memory cell array may include a plurality of memory blocks. Each memory block may include a plurality of memory cells, and the plurality of memory cells may constitute a plurality of pages. In an embodiment, the page may be a unit for storing data in the memory device 100 or reading data stored in the memory device 100. The memory block may be a unit for erasing data.

In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, for convenience of description, a case where the memory device 100 is a NAND flash memory is assumed and described.

In an embodiment, the memory device 100 may be implemented in a two-dimensional array structure or three-dimensional array structure. Hereinafter, although a case where the memory device 100 is implemented in the three-dimensional array structure is described as an embodiment, the present disclosure is not limited to the three-dimensional array structure. The present disclosure may be applied to not only a flash memory device in which a charge storage layer is configured with a Floating Gate (FG) but also a Charge Trap Flash (CTF) in which a charge storage layer is configured with an insulating layer.

In an embodiment, the memory device 100 may be operated using a Single Level Cell (SLC) method in which one data bit is stored in one memory cell. Alternatively, the memory device 100 may be operated using a method in which at least two data bits are stored in one memory cell. For example, the memory device 100 may be operated using a Multi-Level Cell (MLC) method in which two data bits are stored in one memory cell, a Triple Level Cell (TLC) method in which three data bits are stored in one memory cell, or a Quadruple Level Cell (QLC) method in which four data bits are stored in one memory cell.

The memory device 100 is configured to receive a command and an address from the memory controller 200 and access an area selected by the address in the memory cell array. That is, the memory device 100 may perform an operation corresponding to the command on the area selected by the address. For example, the memory device 100 may perform a write (program) operation, a read operation, and an erase operation according to the received command. For example, when a program command is received, the memory device 100 may program data in the area selected by the address. When a read command is received, the memory device 100 may read data from the area selected by the address. When an erase command is received, the memory device 100 may erase data stored in the area selected by the address.

In an embodiment, the memory device 100 may perform background media scan (BGMS). The BGMS may be performed at an idle time at which no command is received from the memory controller 200. Also, the BGMS may be performed to prevent, in advance, a read fail, i.e., uncorrectable error correction codes (UECC) of read data in a read operation.

For example, the memory device 100 may scan (read) data stored in memory cells at an idle time, and selecting a page having a high probability that a read fail will occur, based on the scanning result, thereby performing a refresh operation. The memory device 100 may scan data sequentially according to memory block numbers or according to random memory block numbers.

In the present disclosure, in the BGMS, the memory device 100 may detect a page having a probability that UECC of data stored in the page will potentially occur through scanning of the data, and program the data of the detected page in another memory block, so that the UECC can be prevented in advance. The memory device 100 does not output any pass/fail signal but may detect a page having a probability that UECC will occur through sensing of a current in a read operation.

Consequently, the memory device 100 of the present disclosure detects a page having a probability that UECC will potentially occur due to read disturb and retention through only sensing of a current. Thus, detection time can be reduced and the reliability of data can be improved.

In an embodiment, the memory device 100 may include a current sensing unit 150, a string determiner 170, and a read reclaim controller 190 such that the memory device 100 can detect a page having a probability that UECC will potentially occur through only sensing of a current.

In an embodiment, the current sensing unit 150 may sense a current flowing through turn-on memory cells among memory cells of a selected page. The current sensing unit 150 may include a plurality of NMOS transistors or a plurality of PMOS transistors to sense a current. The current sensing unit 150 may sense a current, based on a read voltage and a sensing node voltage of each page buffer.

In an embodiment, the string determiner 170 may determine a number of strings connected to turned-on memory cells among a plurality of strings, based on a sensing current output from the current sensing unit 150.

In an embodiment, the read reclaim controller 190 may perform a read reclaim or addition pulse applying operation, based on the number of strings, which the string determiner 170 determines.

For example, when the determined number of strings is '0,' the read reclaim controller 190 may perform the additional pulse applying operation. The additional pulse applying operation may be an operation of applying a voltage to a word line or substrate, to which memory cells of a page on which the BGMS is performed are connected.

However, when the determined number of strings is not '0,' the read reclaim controller 190 may perform the read reclaim operation by using a changed read voltage level. The changed read voltage level may be determined according to the determined number of strings.

The memory controller 200 may control overall operations of the storage device 50.

When a power voltage is applied to the storage device 50, the memory controller 200 may execute firmware (FW). When the memory device 100 is a flash memory device, the memory controller 200 may execute FW such as a Flash Translation Layer (FTL) for controlling communication between the host 300 and the memory device 100.

In an embodiment, the memory controller 200 may include firmware (not shown) which receives data and a logical block address LBA from the host 300, and translates the logical block address LBA into a physical block address PBA representing addresses of memory cells included in the memory device 100, in which data is to be stored. Also, the memory controller 200 may store, in a buffer memory (not shown), a logical-physical address mapping table that establishes a mapping relationship between the logical block address LBA and the physical block address PBA.

The memory controller 200 may control the memory device 100 to perform a program operation, a read operation, an erase operation, or the like in response to a request from the host 300. For example, when a program request is received from the host 300, the memory controller 200 may change the program request into a program command, and provide the memory device 100 with the program command, a physical block address PBA, and data. When a read request is received together with a logical block address LBA from the host 300, the memory controller 200 may change the read request into a read command, select a physical block address PBA corresponding to the logical block address LBA, and then provide the memory device 100 with the read command and the physical block address PBA. When an erase request is received together with a logical block address LBA from the host 300, the memory controller 200 may change the erase request into an erase command, select a physical block address PBA corresponding to the logical block address LBA, and then provide the memory device 100 with the erase command and the physical block address PBA.

In an embodiment, the memory controller 200 may control at least two memory devices. The memory controller 200 may control the memory devices according to an interleaving scheme to improve operational performance.

The host 300 may communicate with the storage device 50, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a Universal Flash Storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
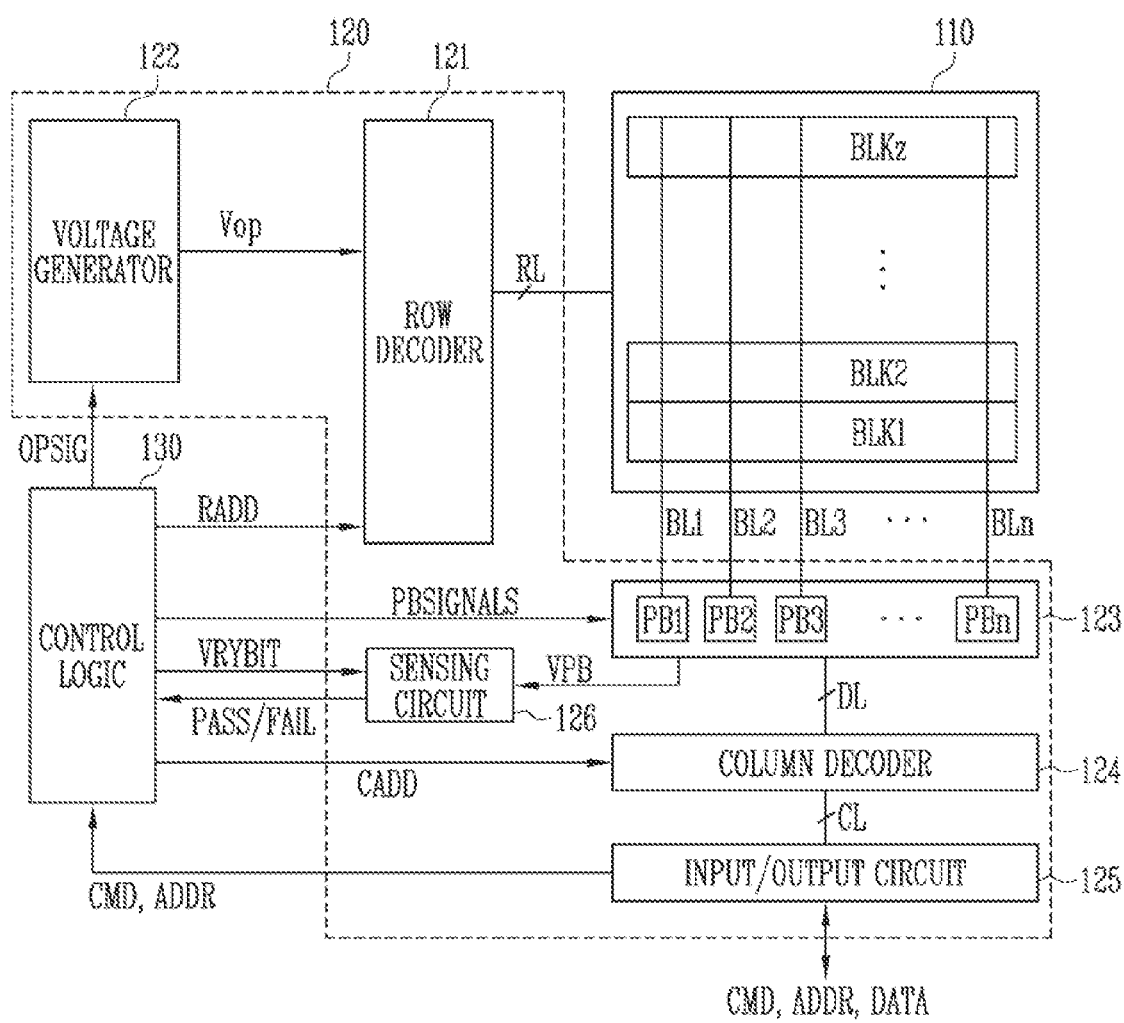
FIG. 2 is a diagram illustrating a structure of a memory device shown in FIG. 1.

FIG. 2 is a diagram illustrating a structure of the memory device shown in FIG. 1.

Referring to FIG. 2, the memory device 100 may include a memory cell array 110, a peripheral circuit 120, and control logic 130. The control logic 130 may be implemented as hardware, software, or a combination of hardware and software. For example, the control logic 130 may be a control logic circuit operating in accordance with an algorithm and/or a processor executing control logic code.

The memory cell array 110 includes a plurality of memory blocks BLK1 to BLKz. The plurality of memory blocks BLK1 to BLKz are connected to a row decoder 121 through row lines RL. The plurality of memory blocks BLK1 to BLKz are connected to a page buffer group 123 through bit lines BL1 to BLn. Each of the plurality of memory blocks BLK1 to BLKz includes a plurality of memory cells. In an embodiment, the plurality of memory cells may be nonvolatile memory cells. Memory cells connected to the same word line may be defined as one page. Therefore, one memory block may include a plurality of pages.

The row lines RL may include at least one source select line, a plurality of word lines, and at least one drain select line.

Each of the memory cells included in the memory cell array 110 may be configured as a Single Level Cell (SLC) storing one data bit, a Multi-Level Cell (MLC) storing two data bits, a Triple Level Cell (TLC) storing three data bits, or a Quadruple Level Cell (QLC) storing four data bits.

The peripheral circuit 120 may perform a program operation, a read operation or an erase operation on a selected region of the memory cell array 110 under the control of the control logic 130. The peripheral circuit 120 may drive the memory cell array 110. For example, the peripheral circuit 120 may apply various operating voltages to the row lines RL and the bit lines BL1 to BLn or discharge the applied voltages under the control of the control logic 130.

The peripheral circuit 120 may include the row decoder 121, the voltage generator 122, the page buffer group 123, a column decoder 124, an input/output circuit 125, and a sensing circuit 126.

The row decoder 121 is connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 decodes a row address RADD received from the control logic 130. The row decoder 121 selects at least one memory block among the memory blocks BLK1 to BLKz according to the decoded address. Also, the row decoder 121 may select at least one word line of the selected memory block to apply voltages generated by the voltage generator 122 to the at least one word line WL according the decoded address.

For example, in a program operation, the row decoder 121 may apply a program voltage to the selected word line, and apply a program pass voltage having a level lower than that of the program voltage to unselected word lines. In a program verify operation, the row decoder 121 may apply a verify voltage to the selected word line, and apply a verify pass voltage higher than the verify voltage to the unselected word lines. In a read operation, the row decoder 121 may apply a read voltage to the selected word line, and apply a read pass voltage higher than the read voltage to the unselected word lines.

In an embodiment, an erase operation of the memory device 100 is performed in a memory block unit. In the erase operation, the row decoder 121 may select one memory block according to the decoded address. In the erase operation, the row decoder 121 may apply a ground voltage to word lines connected to the selected memory block.

The voltage generator 122 operates under the control of the control logic 130. The voltage generator 122 generates a plurality of voltages by using an external power voltage supplied to the memory device 100. Specifically, the voltage generator 122 may generate various operating voltages Vop used in program, read, and erase operations in response to an operation signal OPSIG. For example, the voltage generator 122 may generate a program voltage, a verify voltage, a pass voltage, a read voltage, an erased voltage, and the like under the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate a plurality of voltages by using the external power voltage or the internal power voltage.

For example, the voltage generator 122 may include a plurality of pumping capacitors for receiving the internal power voltage, and generate the plurality of voltages by selectively activating the plurality of pumping capacitors under the control of the control logic 130.

The plurality of generated voltages may be supplied to the memory cell array 110 by the row decoder 121.

The page buffer group 123 includes first to nth page buffers PB1 to PBn. The first to nth page buffers PB1 to PBn are connected to the memory cell array 110 respectively through first to nth bit lines BL1 to BLn. The first to nth bit lines BL1 to BLn operate under the control of the control logic 130. Specifically, the first to nth bit lines BL1 to BLn may operate in response to page buffer control signals PBSIGNALS. For example, the first to nth page buffers PB1 to PBn may temporarily store data received through the first to nth bit lines BL1 to BLn, or sense a voltage or current of the bit lines BL1 to BLn in a read or verify operation.

Specifically, in a program operation, the first to nth page buffers PB1 to PBn may transfer data DATA received through the input/output circuit 125 to selected memory cells through the first to nth bit lines BL1 to BLn, when a program voltage is applied to a selected word line. Memory cells of a selected page are programmed according to the transferred data DATA. In a program verify operation, the first to nth page buffers PB1 to PBn read page data by sensing a voltage or current received from the selected memory cells through the first to nth bit lines BL1 to BLn.

In a read operation, the first to nth page buffers PB1 to PBn read data DATA from the memory cells of the selected page through the first to nth bit lines BL1 to BLn, and outputs the read data DATA to the input/output circuit 125 under the control of the column decoder 124.

In an erase operation, the first to nth page buffers PB1 to PBn may float the first to nth bit lines BL1 to BLn or apply an erase voltage.

The column decoder 124 may communicate data between the input/output circuit 125 and the page buffer group 123 in response to a column address CADD. For example the column decoder 124 may communicate data with the first to nth page buffers PB1 to PBn through data lines DL, or communicate data with the input/output circuit 125 through column lines CL.

The input/output circuit 125 may transfer a command CMD and an address ADDR, which are received from the memory controller (200 shown in FIG. 1), to the control logic 130, or exchange data DATA with the column decoder 124.

In a read operation or verify operation, the sensing circuit 126 may generate a reference current in response to an allow bit VRYBIT signal, and output a pass or fail signal PASS/FAIL by comparing a sensing voltage VPB received from the page buffer group 123 and a reference voltage generated by the reference current.

The control logic 130 may control the peripheral circuit 120 by outputting the operation signal OPSIG, the row address RADD, the page buffer control signals PBSIGNALS, and the allow bit VRYBIT in response to the command CMD and the address ADDR. For example, the control logic 130 may control a read operation of a selected memory block in response to a sub-block read command and an address. Also, the control logic 130 may control an erase operation of a selected sub-block included in the selected memory block in response to a sub-block erase command and an address. Also, the control logic 130 may determine whether the verify operation has passed or failed in response to the pass or fail signal PASS or FAIL.

Figure 3:
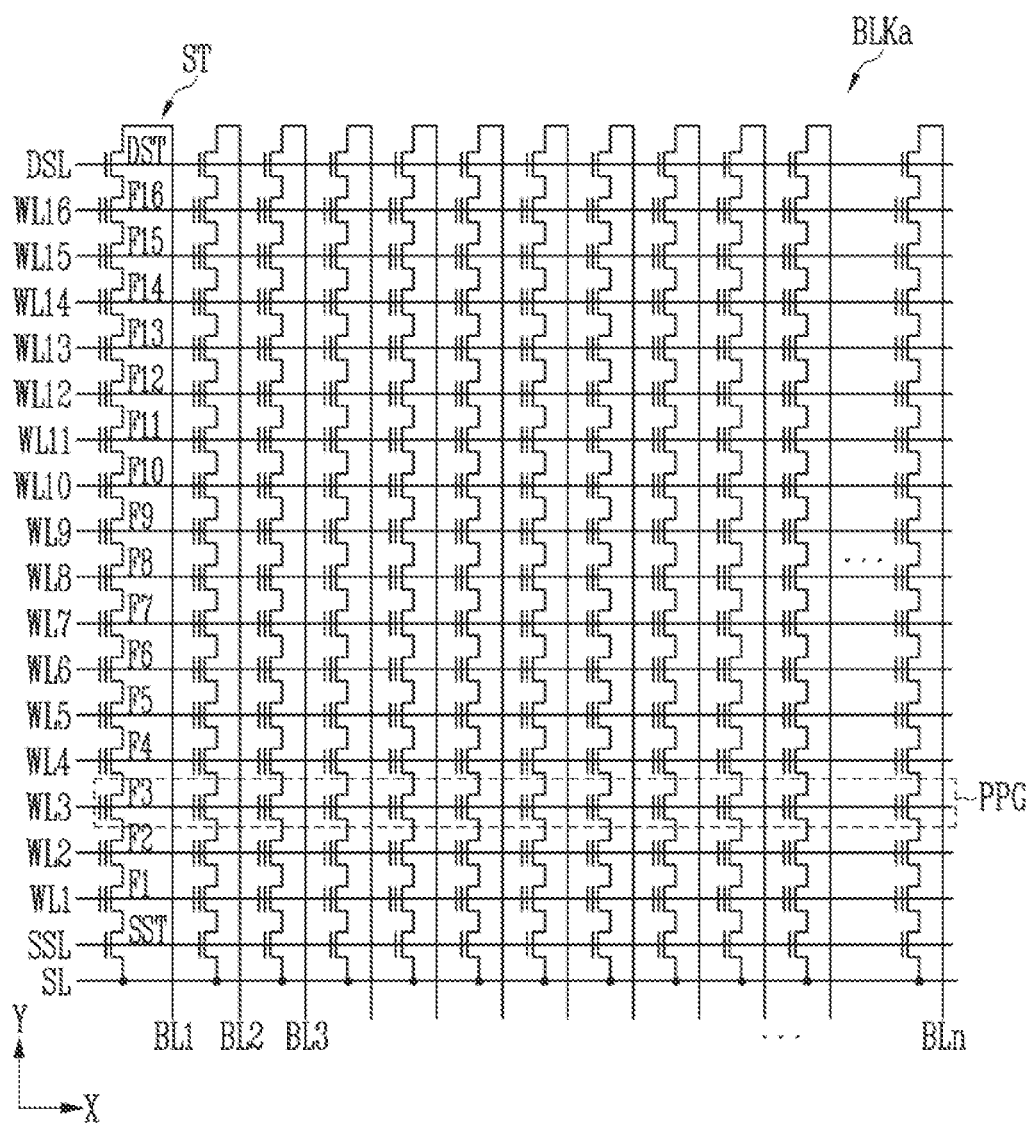
FIG. 3 is a diagram illustrating an embodiment of a memory cell array shown in FIG. 2.

FIG. 3 is a diagram illustrating an embodiment of the memory cell array shown in FIG. 2.

Referring to FIGS. 2 and 3, FIG. 3 is a circuit diagram illustrating any one memory block BLKa among the plurality of memory blocks BLK1 to BLKz included in the memory cell array 110 shown in FIG. 2.

In the memory block BLKa, a first select line, word lines, and a second select line, which are arranged in parallel, may be connected to each other. For example, the word lines may be arranged in parallel between the first and second select lines. The first select line may be a source select line SSL, and the second select line may be a drain select line DSL.

More specifically, the memory block BLKa may include a plurality of strings connected between bit lines BL1 to BLn and a source line SL. The bit lines BL1 to BLn may be respectively connected to the strings, and the source line SL may be commonly connected to the strings. The strings may be configured identically to one another, and therefore, a string ST connected to a first bit line BL1 will be described as an example.

The string ST may include a source select transistor SST, a plurality of memory cells F1 to F16, and a drain select transistor DST, which are connected in series to each other between the source line SL and the first bit line BL1. At least one source select transistor SST and at least one drain select transistor DST may be included in one string ST, and memory cells of which number is greater than that of the memory cells F1 to F16 shown in the drawing may be included in the one string ST.

A source of the source select transistor SST may be connected to the source line SL, and a drain of the drain select transistor DST may be connected to the first bit line BL1. The memory cells F1 to F16 may be connected in series between the source select transistor SST and the drain select transistor DST. Gates of source select transistors SST included in different strings may be connected to the source select line SSL, and gates of drain select transistors DST included in different strings may be connected to the drain select line DSL. Gates of the memory cells F1 to F16 may be connected to a plurality of word lines WL1 to WL16. A group of memory cells connected to the same word line among memory cells included in different strings may be referred to as a physical page PPG. Therefore, physical pages corresponding to the number of the word lines WL1 to WL16 may be included in the memory block BLKa.

One memory cell may store data of one bit. The memory cell is generally referred to as a single level cell (SLC). One physical page PPG may store one logical page (LPG) data. The one LPG data may include data bits of which number corresponds to that of cells included in one physical page PPG. Alternately, one memory cell MC may store data of two or more bits. The memory cell is generally referred to as a multi-level cell (MLC). One physical page PPG may store two or more LPG data.

A memory cell for storing data of two or more bits is referred to as the MLC. As the number of bits of data stored in one memory cell increases, the MLC has recently meant as a memory cell for storing data of two bits. A memory cell for storing data of three or more bits is referred to as a triple level cell (TLC), and a memory cell for storing data of four or more bits is referred to as a quadruple level cell (QLC). Besides, memory cells for storing data of a plurality of bits have been developed, and this embodiment may be applied to memory systems in which data of two or more bits are stored.

In another embodiment, each of the plurality of memory blocks may have a three-dimensional structure. Each memory block may include a plurality of memory cells stacked on a substrate. The plurality of memory cells may be arranged along +X, +Y, and +Z directions.

Figure 4:
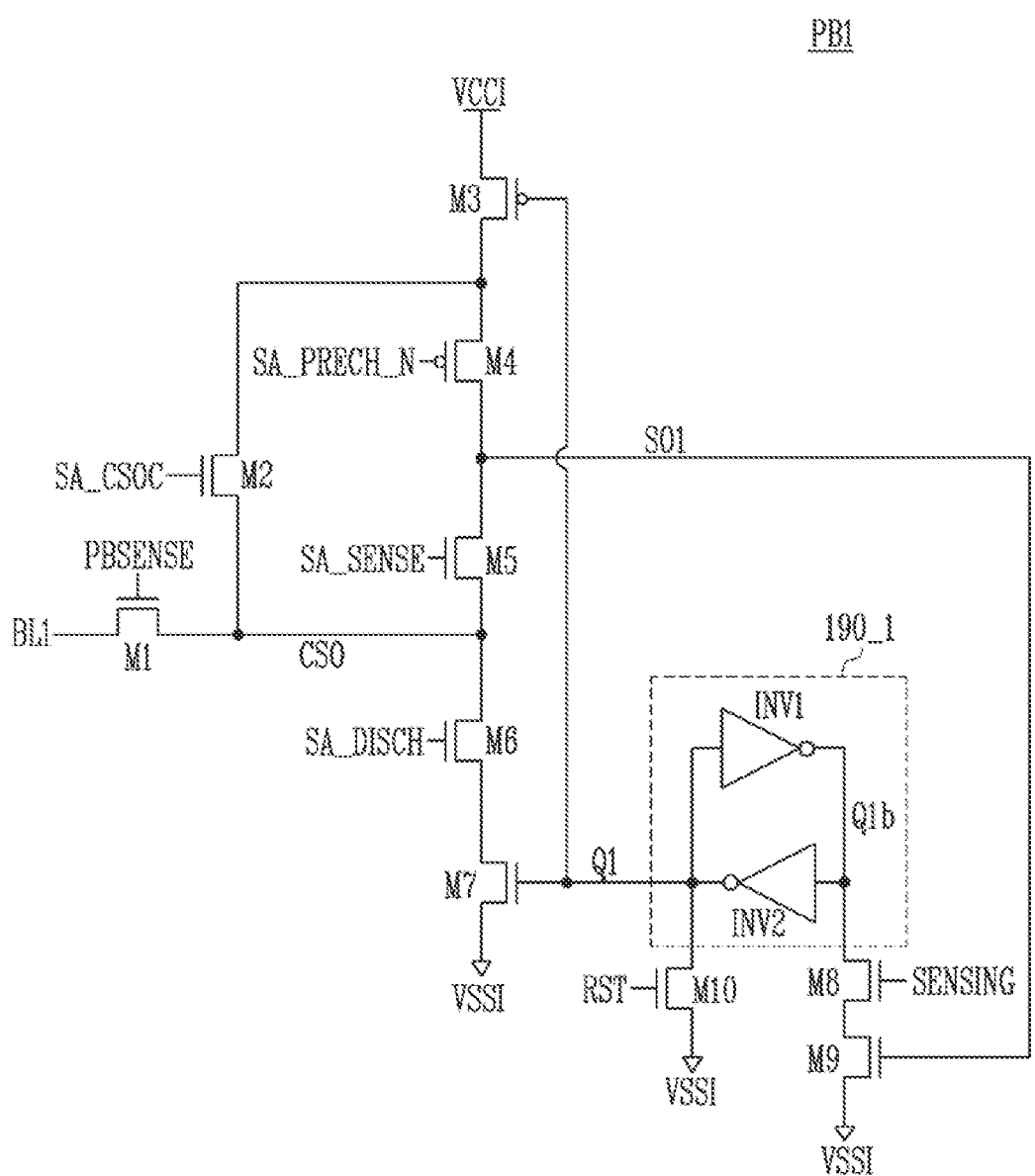
FIG. 4 is a diagram illustrating components of a page buffer connected to a bit line.

FIG. 4 is a diagram illustrating components of a page buffer connected to a bit line.

Referring to FIGS. 2 and 4, a first page buffer PB1 among the plurality of page buffers PB1 to PBn shown in FIG. 2 is illustrated. Each of second to nth page buffers PB2 to PBn may also be configured with the same components as FIG. 4.

In an embodiment, the first page buffer PB1 is connected to a first memory cell MC1 through a first bit line BL1, and may perform a bit line precharge (BL precharge) operation of charging, to the first bit line BL1, charges supplied from an internal power voltage VCCI through first to fifth transistor M1 to M5. The first transistor M1 is controlled by a first sense signal PBSENSE, the second transistor M2 is controlled by a first precharge signal SA_CSOC, and the third transistor M3 is controlled by a first latch 190_1. In addition, the fourth transistor M4 is controlled by a second precharge signal SA_PRECH_N, and the fifth transistor M5 is controlled by a second sense signal SA_SENSE.

Also, the first page buffer PB1 may discharge, to an internal ground voltage VSSI, charges charged to the first bit line BL1 through the first transistor M1, a sixth transistor M6, and a seventh transistor M7. The sixth transistor M6 is controlled by a first discharge signal SA_DISCH, and the seventh transistor M7 is controlled by the first latch 190_1.

In an embodiment, the first page buffer PB1 may include the first latch 190_1 including a first inverter INV1 and a second inverter INV2. The first latch 190_1 may control the bit line precharge (BL precharge) operation by turning on or turning off the third transistor M3 through a first Q node Q1. A first Q bar node Q1b and the first Q node Q1 have values inverted to each other.

A voltage of a first sensing node SO1 during a sensing operation on the first memory cell MC1 is determined based on a threshold voltage of the first memory cell MC1. The first latch 190_1 may store a result obtained by sensing the threshold voltage of the first memory cell MC1 through a ninth transistor M9 connected to the first sensing node SO1. The ninth transistor M9 may be an N-type MOS transistor, and the first sensing node SO1 may be connected to a gate node of the ninth transistor M9.

Therefore, when the threshold voltage of the first memory cell MC1 is low, the first sensing node SO1 may become low during the sensing operation, and the ninth transistor M9 may be turned off. When the threshold voltage of the first memory cell MC1 is high, the sensing node SO1 may become high during the sensing operation, and the ninth transistor M9 may be turned on.

In an embodiment, the first inverter INV1 and the second inverter INV2, which are included in the first latch 190_1, are respectively connected to the internal power voltage VCCI and the internal ground voltage VSSI.

Figure 5:
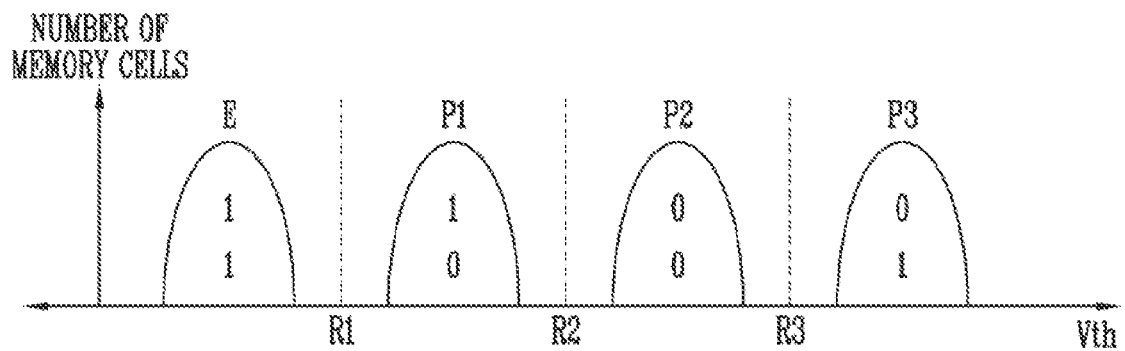
FIG. 5 illustrates a threshold voltage distribution of memory cells and a read voltage when a program operation is performed by using a multi-level cell method.

FIG. 5 illustrates a threshold voltage distribution of memory cells and a read voltage when a program operation is performed by using a multi-level cell method.

Referring to FIG. 5, FIG. 5 illustrates a threshold voltage distribution of selected memory cells of a selected page when the memory device (100 shown in FIG. 1) performs a program operation by using a multi-level cell (MLC) method, i.e., when data corresponding to 2 bits is stored in memory cells. In FIG. 5, the horizontal axis represents threshold voltage Vth according to a state of memory cells, and the vertical axis represents number of memory cells. Each of the memory cells may be programmed to have a threshold voltage corresponding to any one of an erase state E, a first program state P1, a second program state P2, and a third program state P3.

FIG. 5 illustrates a case where the memory device (100 shown in FIG. 1) performs the program operation by using the multi-level cell (MLC) method, but the present disclosure may also be applied to a case where the memory device (100 shown in FIG. 1) performs the program operation by using a single level cell (SLC) method, a triple level cell (TLC) method, or a quadruple level cell (QLC) method.

In an embodiment, the erase state E may correspond to data '11,' the first program state P1 may correspond to data '10,' the second program state P2 may correspond to data '00,' and the third program state P3 may correspond to data '01.' However, data corresponding to each program state is merely illustrative, and may be variously modified.

In an embodiment, the threshold voltage distribution of the memory cells may be shifted by read disturb or retention. The read disturb may mean that the threshold voltage distribution of memory cells of pages adjacent to a selected page is shifted when a read operation is performed on the selected page. The retention may mean that the threshold voltage distribution of memory cells is shifted by a period from a time at which power applied to the memory device (100 shown in FIG. 1) is off to a time at which the power is applied to the memory device, i.e., a retention period.

In an embodiment, the movement of charges trapped in a floating gate (FG) of the memory cells may increase as the retention period increases. Therefore, the threshold voltage of the memory cells may become low as the movement of the charges trapped in the FG. Consequently, the threshold voltage of the memory cells may become low as the retention period increases.

In addition, in the case of the retention, the threshold voltage distribution may be changed according to a program state of each of the memory cells. That is, the threshold voltage distribution of the memory cell may be changed according to the number of charges trapped in the FG. For example, since the number of charges trapped in the FG of the memory cell becomes larger as the program state becomes higher, shifting of the threshold voltage distribution in a high program state may be greater than that of the threshold voltage distribution in a low program state.

That the number of charges trapped in the FG is large may mean that the number of charges discharged from the FG is large. Therefore, the shifting of the threshold voltage distribution may become larger as the program state of memory cells becomes higher.

In an embodiment, the memory device (100 shown in FIG. 1) may perform a read operation for distinguishing the erase state E, the first program state P1, the second program state P2, and the third program state P3 from each other.

Specifically, the memory device (100 shown in FIG. 1) may perform the read operation by using a voltage R1 for distinguishing the erase state E and the first program state P1 from each other, a voltage R2 for distinguishing the first program state P1 and the second program state P2 from each other, and a voltage R3 for distinguishing the second program state P2 and the third program state P3 from each other.

In an embodiment, the memory device (100 shown in FIG. 1) may program randomized data in the memory cell array (110 shown in FIG. 2) in the program operation. Therefore, a number of turned-on memory cells when the read operation on a selected page is performed by using the voltages R1 to R3 may be predicted in background media scan (BGMS). That is, memory cells are programmed with a uniform number to the erase state E, the first program state P1, the second program state P2, and the third program state P3 in the program operation of the memory device (100 shown in FIG. 1), the ratio of turned-on or turned-off memory cells among memory cells included in the selected page may be constant in the BGMS.

In the present disclosure, the memory device (100 shown in FIG. 1) may set a reference current, based on the number of memory cells predicted to be turned on when the read operation is performed by using the voltages R1 to R3 in the BGMS. When the reference current is set, the memory device (100 shown in FIG. 1) may compare the reference current with a sensing current sensed through the current sensing unit 150 by applying any one read voltage among the voltages R1 to R3 to a selected word line. The memory device (100 shown in FIG. 1) may perform a read reclaim or additional pulse applying operation, based on the comparison result.

Figure 6:
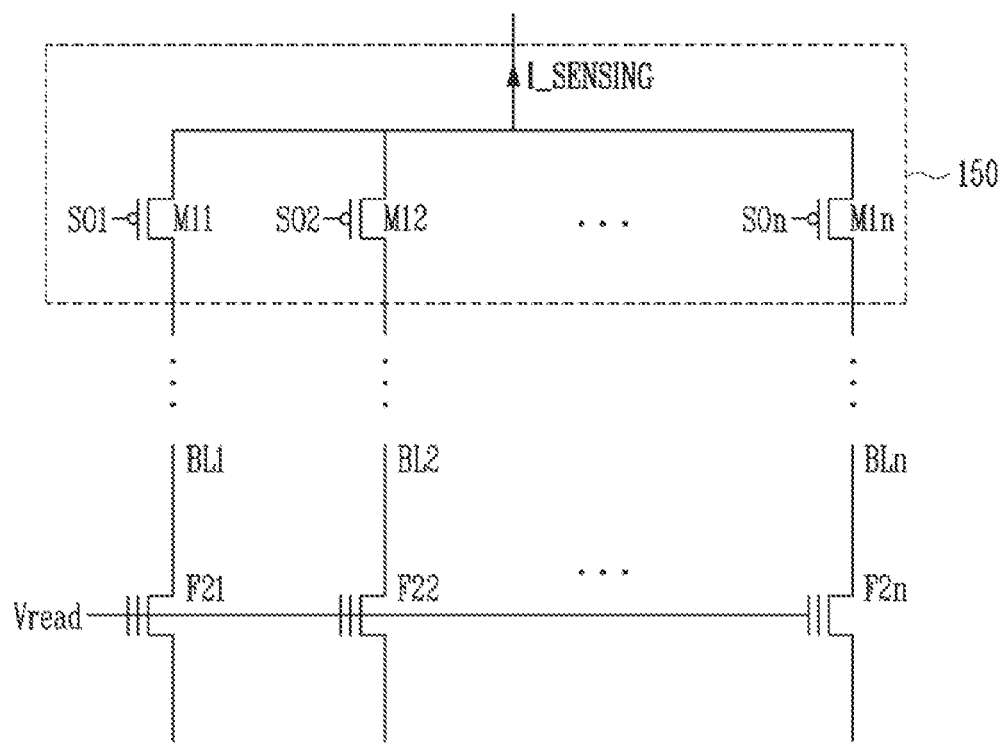
FIG. 6 is a diagram illustrating a sensing current in background media scan.

FIG. 6 is a diagram illustrating a sensing current in background media scan.

Referring to FIGS. 1, 3, and 6, FIG. 6 illustrates selected memory cells F21 to F2n connected to the current sensing unit 150 shown in FIG. 1 and a selected word line among the plurality of word lines WL1 to WL16 shown in FIG. 3. The current sensing unit 150 may include a plurality of sensing transistors M11 to M1n. Sensing transistors of which number corresponds to that of memory cells respectively connected to the plurality of word lines (WL1 to WL16 shown in FIG. 3) may be included in the current sensing unit 150.

In an embodiment, the current sensing unit 150 may be connected between the memory cell array (110 shown in FIG. 2) and the page buffer group (123 shown in FIG. 2) through the plurality of bit lines BL1 to BLn. The current sensing unit 150 may sense a sensing current I_SENSING as a current flowing the plurality of sensing transistors M11 to M1n in background media scan (BGMS).

In another embodiment, the current sensing unit 150 may be included in the page buffer group (123 shown in FIG. 2).

In FIG. 6, each of the plurality of sensing transistors M11 to M1n is illustrated as a PMOS transistor. However, in another embodiment, each of the plurality of sensing transistors M11 to M1n may be an NMOS transistor.

In an embodiment, randomized data may be programmed to the selected memory cells F21 to F2n. Therefore, the selected memory cells F21 to F2n may be programmed with a uniform number to any one state among the erase state E, the first program state P1, the second program state P2, and the third program state P3. Also, the selected memory cells F21 to F2n may be turned on or turned off according to a read voltage Vread.

Referring to FIG. 4, a sensing node voltage of each page buffer may be applied to each gate of the plurality of sensing transistors M11 to M1n. For example, a voltage of the first sensing node SO1 of the first page buffer PB1 included in the page buffer group (123 shown in FIG. 2) may be applied to an eleventh sensing transistor M11, and a voltage of a second sensing node SO2 of the second page buffer PB2 included in the page buffer group (123 shown in FIG. 2) may be applied to a twelfth sensing transistor M12.

In an embodiment, when a threshold voltage of the selected memory cells F21 to F2n is lower than the read voltage Vread, the selected memory cells F21 to F2n may be turned on. Also, when the threshold voltage of the selected memory cells F21 to F2n is lower than the read voltage Vread, eleventh to 1nth sensing transistors M11 to M1n may be turned on. That is, when the threshold voltage of the selected memory cells F21 to F2n is lower than the read voltage Vread, the sensing node of a page buffer connected through each bit line may become low, and the eleventh to 1nth sensing transistors M11 to M1n may be turned on.

On the contrary, when the threshold voltage of the selected memory cells F21 to F2n is higher than the read voltage Vread, the selected memory cells F21 to F2n may be turned off. Also, when the threshold voltage of the selected memory cells F21 to F2n is higher than the read voltage Vread, the eleventh to 1nth sensing transistors M11 to M1n may be turned off. That is, when the threshold voltage of the selected memory cells F21 to F2n is higher than the read voltage Vread, the sensing node of a page buffer connected through each bit line may become high, and the eleventh to 1nth sensing transistors M11 to M1n may be turned off.

Consequently, when the threshold voltage of the selected memory cells F21 to F2n is lower than the read voltage Vread, the selected memory cells F21 to F2n and the eleventh to 1nth sensing transistors M11 to M1n are turned on, and hence a current can flow through the eleventh to 1nth sensing transistors M11 to M1n.

The selected memory cells F21 to F2n are programmed with the uniform number to any one state among the erase state E, the first program state P1, the second program state P2, and the third program state P3, and hence the sensing current I_SENSING flowing at a specific read voltage can be predicted.

Accordingly, in the present disclosure, there is proposed a method for setting a predicted sensing current as a reference current and performing a read reclaim or additional pulse applying operation, based on a result obtained by comparing a sensing current with the reference current.

Figures 7, 8:
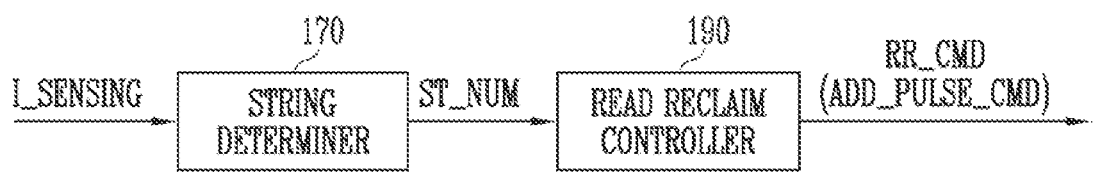
FIG. 7 is a diagram illustrating a process in which a read reclaim or additional pulse applying operation is performed based on a sensing current.
FIG. 8 illustrates a reference current.

FIG. 7 is a diagram illustrating a process in which a read reclaim or additional pulse applying operation is performed based on a sensing current.

Referring to FIGS. 1 and 7, FIG. 7 illustrates operations of the string determiner 170 and the read reclaim controller 190, which are shown in FIG. 1. The string determiner 170 and the read reclaim controller 190 may be located at the inside of the control logic (130 shown in FIG. 2) or be located at the outside of the control logic (130 shown in FIG. 2). The read reclaim controller 190 may control the peripheral circuit (120 shown in FIG. 2) to perform a read reclaim or additional pulse applying operation.

In an embodiment, the string determiner 170 may determine a string number ST_NUM by comparing a sensing current I_SENSING with a reference current I_REF. The sensing current I_SENSING is may be a current received from the current sensing unit (150 shown in FIG. 6), and the reference current I_REF may be a current predicted to be sensed by the current sensing unit (150 shown in FIG. 6) when a read voltage is applied to a selected word line.

For example, the string determiner 170 may determine a string number ST_NUM connected to turned-on memory cells, based on a result obtained by comparing the sensing current I_SENSING with the reference current I_REF.

Specifically, when the sensing current I_SENSING is within an error range of the reference current I_REF, the string determiner 170 may determine the string number as '0.' However, when the sensing current I_SENSING is not within the error range of the reference current I_REF, the string determiner 170 may determine the string number ST_NUM which is not '0.'

For example, when the sensing current I_SENSING is greater than the reference current I_REF, memory cells of which number is greater than that of the memory cells predicted to be turned on may be turned on. That is, memory cells of which number is greater than that of the predicted memory cells may be turned on due to shifting of the threshold voltage distribution of the memory cells (left-shifting). The string determiner 170 may determine a string number ST_NUM to which additionally turned-on memory cells are connected.

On the contrary, when the sensing current I_SENSING is smaller than the reference current I_REF, memory cells of which number is smaller than that of the memory cells predicted to be turned on may be turned on. That is, memory cells of which number is smaller than that of the predicted memory cells may be turned on due to shifting of the threshold voltage distribution of the memory cells (right-shifting). The string determiner 170 may determine a string number ST_NUM to which memory cells which are not turned on are connected.

In an embodiment, the read reclaim controller 190 may output a read reclaim command RR_CMD or an additional pulse command ADD_PULSE_CMD, based on the string number ST_NUM received from the string determiner 170. The read reclaim command RR_CMD may be a command instructing the memory device (100 shown in FIG. 1) to move, to a free block, data of a memory block including a selected page connected to a selected word line after being read by using a changed read voltage. In addition, the additional pulse command ADD_PULSE_CMD may be a command instructing the memory device (100 shown in FIG. 1) to apply an additional pulse to a selected word line or a substrate.

For example, when the string number ST_NUM is '0,' the read reclaim controller 190 may output the additional pulse command ADD_PULSE_CMD. When the sensing current I_SENSING is greater than the reference current I_REF, the additional pulse may be applied to the selected word line. When the sensing current I_SENSING is smaller than the reference current I_REF, the additional pulse may be applied to the substrate.

Also, when the string number ST_NUM is not '0,' the read reclaim controller 190 may output the read reclaim command RR_CMD. The memory device (100 shown in FIG. 1) may read data of a memory block including a selected page connected to a selected word line by using a changed read voltage level and move the read data to a free block, in response to the read reclaim command RR_CMD.

FIG. 8 illustrates a reference current.

Referring to FIGS. 5 and 8, FIG. 8 illustrates a reference current I_REF as a sensing current predicted when data is read by using the read voltages shown in FIG. 5. In FIG. 8, it is assumed that a program operation on selected memory cells connected to a selected word line among the plurality of word lines (WL1 to WL16 shown in FIG. 3) is completed. When the program operation on the selected memory cells is not completed, the reference current I_REF may be set differently.

In FIG. 8, it is assumed that the unit of current is 'µA.'

In an embodiment, randomized data may be programmed in selected memory cells F21 to F2n. Therefore, since the selected memory cells F21 to F2n are programmed with a uniform number to any one state among the erase state E, the first program state P1, the second program state P2, and the third program state P3, and hence a sensing current I_SENSING flowing when any one voltage among the voltages R1, R2, and R3 is applied to the selected word line may be predicted.

For example, in FIG. 5, when the voltage R1 is applied to the selected word line, the sensing current I_SENSING may be predicted as '25' according to the number of memory cells predicted to be turned on or turned off among the selected memory cells of the selected word line. That is, when the read voltage is the voltage R1, the reference current I_REF may be set as 25 µA.

As described above, when the read voltage is the voltage R2, the reference current I_REF may be set as 50 µA. When the read voltage is the voltage R3, the reference current I_REF may be set as 75 µA.

In an embodiment, when the reference current I_REF is set, the string determiner (170 shown in FIG. 7) may determine a string number ST_NUM, based on a result obtained by comparing the sensing current I_SENSING sensed by the current sensing unit (150 shown in FIG. 6) with the reference current I_REF.

Figure 9:
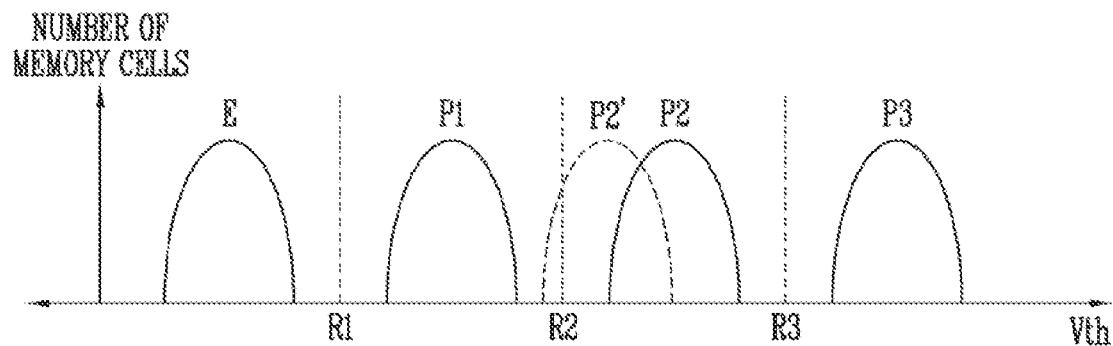
FIG. 9 illustrates an embodiment of a sensing current detected according to shifting of a threshold voltage distribution.

FIG. 9 illustrates an embodiment of a sensing current detected according to shifting of a threshold voltage distribution.

Referring to FIGS. 5, 6, and 9, FIG. 9 illustrates a reference current I_REF and the sensing current I_SENSING shown in FIG. 6 when data is read by using the voltage R2 in a state in which the threshold voltage distribution shown in FIG. 5 is shifted due to read disturb or retention.

In FIG. 9, it is assumed that the unit of current is 'µA.'

In an embodiment, the threshold voltage distribution of memory cells may be shifted to the left (left-shifting). As the threshold voltage distribution is shifted, the threshold voltage distribution of the second program state P2 may be shifted as a second 'program state P2'. Similarly to that the threshold voltage distribution of the second program state P2 is shifted, the threshold voltage distribution of each of the erase state E, the first program state P1, and the third program state P3 may also be shifted to the left (left-shifting).

When a read operation is performed by using the voltage R2 in a state in which the threshold voltage distribution is shifted to the left, memory cells of which number is greater than that of memory cells predicted to be turned on may be turned on. Therefore, although the reference current I_REF predicted when data is read by using the voltage R2 is '50,' a larger number of memory cells are turned on, and therefore, the sensing current I_SENSING sensed by the current sensing unit (150 shown in FIG. 6) may be '55.'

In an embodiment, since the sensing current I_SENSING is greater than the reference current I_REF, the memory device (100 shown in FIG. 1) may perform a read reclaim operation of reading data of a memory block including a selected page by using a voltage lower than the voltage R2 and moving the read data to a free block or an additional pulse applying operation of applying an additional pulse to a word line to which selected memory cells of a selected page are connected.

For example, when the sensing current I_SENSING is greater than the reference current I_REF while being within an error range of the reference current I_REF, the memory device (100 shown in FIG. 1) may perform the additional pulse applying operation.

However, when the sensing current I_SENSING is greater than the reference current I_REF while not being within the error range of the reference current I_REF, the memory device (100 shown in FIG. 1) may perform the read reclaim operation by using a voltage lower than the voltage R2.

Figure 10:
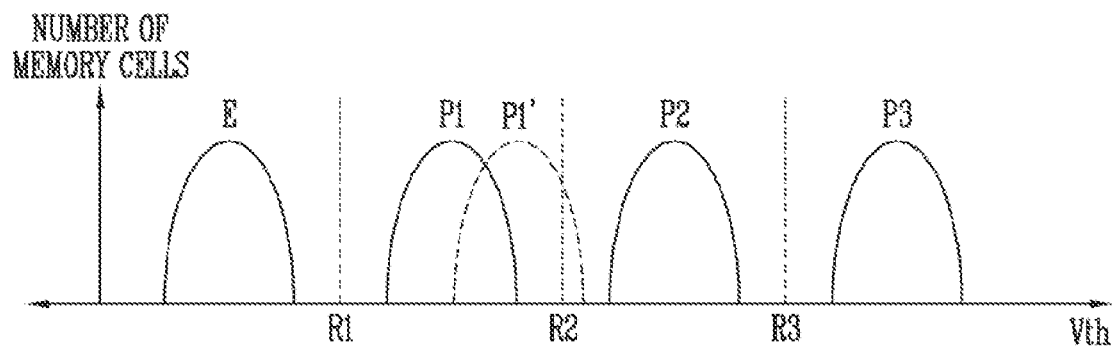
FIG. 10 illustrates an embodiment of a sensing current detected according to shifting of a threshold voltage distribution.

FIG. 10 illustrates an embodiment of a sensing current detected according to shifting of a threshold voltage distribution.

Referring to FIGS. 5, 6, and 10, FIG. 10 illustrates a reference current I_REF and the sensing current I_SENSING shown in FIG. 6 when data is read by using the voltage R2 in a state in which the threshold voltage distribution shown in FIG. 5 is shifted due to read disturb or retention.

In FIG. 10, it is assumed that the unit of current is 'µA.'

In an embodiment, the threshold voltage distribution of memory cells may be shifted to the right (right-shifting). As the threshold voltage distribution is shifted, the threshold voltage distribution of the first program state P1 may be shifted as a first 'program state P1'. Similarly to that the threshold voltage distribution of the first program state P1 is shifted, the threshold voltage distribution of each of the erase state E, the second program state P2, and the third program state P3 may also be shifted to the right (right-shifting).

When a read operation is performed by using the voltage R2 in a state in which the threshold voltage distribution is shifted to the right, memory cells of which number is smaller than that of memory cells predicted to be turned on may be turned on. Therefore, although the reference current I_REF predicted when data is read by using the voltage R2 is '50,' a smaller number of memory cells are turned on, and therefore, the sensing current I_SENSING sensed by the current sensing unit (150 shown in FIG. 6) may be '45.'

In an embodiment, since the sensing current I_SENSING is smaller than the reference current I_REF, the memory device (100 shown in FIG. 1) may perform a read reclaim operation of reading data of a memory block including a selected page by using a voltage higher than the voltage R2 and moving the read data to a free block or an additional pulse applying operation of applying an additional pulse to a substrate of selected memory cells of a selected page.

For example, when the sensing current I_SENSING is smaller than the reference current I_REF while being within an error range of the reference current I_REF, the memory device (100 shown in FIG. 1) may perform the additional pulse applying operation.

However, when the sensing current I_SENSING is smaller than the reference current I_REF while not being within the error range of the reference current I_REF, the memory device (100 shown in FIG. 1) may perform the read reclaim operation by using a voltage higher than the voltage R2.

FIG. 11 illustrates a string number determined based on a reference current and a sensing current.

Referring to FIGS. 9 to 11, FIG. 11 illustrates a string number ST_NUM determined based on a result obtained by comparing a sensing current I_SENSING with the reference current I_REF according to the shifting of the threshold voltage distribution shown in FIGS. 9 and 10. The string number ST_NUM may mean a number of strings connected to turned-on memory cells. Moreover, when the string number ST_NUM has a positive integer value, this may mean that memory cells of which number is greater than that of the memory cells predicted to be turned on are turned on. When the string number ST_NUM has a negative integer value, this may mean that memory cells of which number is smaller than that of the memory cells predicted to be turned on are turned on.

In FIG. 11, it is assumed that the unit of current is 'µA.'

Referring to FIGS. 9 and 10, when randomized data is programmed in a selected page, the threshold voltage distribution of memory cells may be uniform. Therefore, the reference current I_REF may be set as '50,' based on the number of memory cells predicted to be turned on when the selected page is read by using the voltage R2.

In an embodiment, a sensing current I_SENSING actually sensed by the current sensing unit (150 shown in FIG. 6) may be equal to the reference current I_REF or be different from the reference current I_REF due to shifting of the threshold voltage distribution. It may be determined that memory cells of which number is greater than that of the memory cells predicted to be turned on are turned on as the sensing current I_SENSING is greater than the reference current I_REF. On the contrary, it may be determined that memory cells of which number is smaller than that of the memory cells predicted to be turned on are turned on as the sensing current I_SENSING is smaller than the reference current I_REF.

For example, the sensing current I_SENSING may be within an error range (46 to 54) of the reference current I_REF. When the sensing current I_SENSING is within the error range of the reference current I_REF, the string determiner (170 shown in FIG. 7) may determine the string number ST_NUM as '0.' When the string number ST_NUM is determined as '0,' the additional pulse applying operation performed for a relatively short time may be performed, instead of the read reclaim operation performed for a long time. In an embodiment a long time may have a greater duration of time than a short time.

However, when the sensing current I_SENSING is not within the error range (46 to 54) of the reference current I_REF, the string determiner (170 shown in FIG. 7) may determine the string number ST_NUM according to the sensing current I_SENSING.

Specifically, when the sensing current I_SENSING is greater than the reference current I_REF, the string number ST_NUM may be determined as a positive integer value. In addition, the string number ST_NUM representing a number of strings connected to memory cells predicted to be additionally turned on may increase as the sensing current I_SENSING becomes greater than the reference current I_REF.

For example, when the sensing current I_SENSING is '55,' the string number ST_NUM may be set as '1.' When the sensing current I_SENSING is '56,' the string number ST_NUM may be set as '2.' When the sensing current I_SENSING is '57,' the string number ST_NUM may be set as '3.' When the sensing current I_SENSING is '58,' the string number ST_NUM may be set as '4.'

However, when the sensing current I_SENSING is smaller than the reference current I_REF, the string number ST_NUM may be determined as a negative integer value. In addition, the string number ST_NUM representing a number of strings connected to memory cells predicted not to be turned on may decrease as the sensing current I_SENSING becomes smaller than the reference current I_REF.

For example, when the sensing current I_SENSING is '45,' the string number ST_NUM may be set as '−1.' When the sensing current I_SENSING is '44,' the string number ST_NUM may be set as '−2.' When the sensing current I_SENSING is '43,' the string number ST_NUM may be set as '−3.' When the sensing current I_SENSING is '42,' the string number ST_NUM may be set as '−4.'

FIG. 12 is a diagram illustrating a method for performing a read reclaim operation and an additional pulse applying operation according to the string number shown in FIG. 11.

Referring to FIGS. 11 and 12, FIG. 12 illustrates read voltage Vread when the read reclaim operation is performed and pulse voltage VPULSE when the additional pulse operation is performed, based on string number ST_NUM determined by the string determiner (170 shown in FIG. 7) in FIG. 11.

In an embodiment, when the string number ST_NUM is '0,' i.e., when the sensing current I_SENSING is within the error range of the reference current I_REF, the memory device (100 shown in FIG. 1) might not perform the read reclaim operation. That is, since the sensing current I_SENSING is within the error range of the reference current I_REF, the memory device (100 shown in FIG. 1) may perform the additional pulse applying operation, instead of the read reclaim operation performed for a relatively long time as compared to the time it takes to perform the additional pulse applying operation.

In an embodiment, when the string number ST_NUM is '0,' the memory device (100 shown in FIG. 1) may set a voltage level V_ADD to the magnitude of a pulse voltage VPULSE, and apply the voltage level V_ADD to a selected word line or a substrate.

For example, when the sensing current I_SENSING is greater than the reference current I_REF even though the sensing current I_SENSING is within the error range of the reference current I_REF, it may be determined that the threshold voltage distribution has been shifted to the left. Therefore, in order to increase the threshold voltage of memory cells, the memory device (100 shown in FIG. 1) may perform the additional pulse applying operation of applying the voltage V_ADD to the selected word line.

However, when the sensing current I_SENSING is smaller than the reference current I_REF even though the sensing current I_SENSING is within the error range of the reference current I_REF, it may be determined that the threshold voltage distribution has been shifted to the right. Therefore, in order to decrease the threshold voltage of memory cells, the memory device (100 shown in FIG. 1) may perform the additional pulse applying operation of applying the voltage V_ADD to the substrate.

In an embodiment, when the string number ST_NUM is not '0,' i.e., when the sensing current I_SENSING is not within the error range of the reference current I_REF, the memory device (100 shown in FIG. 1) may perform the read reclaim operation. That is, when the sensing current I_SENSING is not within the error range of the reference current I_REF, it is determined that the degree of shifting of the threshold voltage distribution is large, and therefore, the memory device (100 shown in FIG. 1) may perform the read reclaim operation.

In an embodiment, when the string number ST_NUM is not '0,' the memory device (100 shown in FIG. 1) may perform the read reclaim operation by setting a read voltage according to the string number ST_NUM.

For example, when the sensing current I_SENSING is out of the error range of the reference current I_REF and is greater than the reference current I_REF, i.e., when the string number ST_NUM has a positive integer value, it may be determined that the threshold voltage distribution has been shifted to the left. Therefore, the memory device (100 shown in FIG. 1) may read data of a memory block including a selected page by using voltages R21 to R24 lower than the voltage R2, instead of the voltage R2, and move the read data to a free block. The read operation may also be performed by using voltages lower than the voltages R1 and R3 shown in FIG. 9, instead of the voltages R1 and R3.

Specifically, when the read reclaim operation is performed, the read operation may be performed by using a voltage R24, when the string number ST_NUM is '1.' The read operation may be performed by using a voltage R23, when the string number ST_NUM is '2.' The read operation may be performed by using a voltage R22, when the string number ST_NUM is '3.' The read operation may be performed by using a voltage R21, when the string number ST_NUM is '4.' The voltage level may become lower as approaching the voltage R21 from the voltage R24. That is, the threshold voltage distribution is further shifted to the left as the string number ST_NUM increases as a positive value, and therefore, the read voltage level may be set to become low.

However, when the sensing current I_SENSING is out of the error range of the reference current I_REF and is smaller than the reference current I_REF, i.e., when the string number ST_NUM has a negative integer value, it may be determined that the threshold voltage distribution has been shifted to the right. Therefore, the memory device (100 shown in FIG. 1) may read data of a memory block including a selected page by using voltages R25 to R28 higher than the voltage R2, instead of the voltage R2, and move the read data to a free block. The read operation may also be performed by using voltages higher than the voltages R1 and R3 shown in FIG. 10, instead of the R1 and R3.

Specifically, when the read reclaim operation is performed, the read operation may be performed by using a voltage R25, when the string number ST_NUM is '−1.' The read operation may be performed by using a voltage R26, when the string number ST_NUM is '−2.' The read operation may be performed by using a voltage R27, when the string number ST_NUM is '−3.' The read operation may be performed by using a voltage R28, when the string number ST_NUM is '−4.' The voltage level may become higher as approaching the voltage R28 from the voltage R25. That is, the threshold voltage distribution is further shifted to the right as the string number ST_NUM increases as a negative value, and therefore, the read voltage level may be set to become high.

Figure 13:
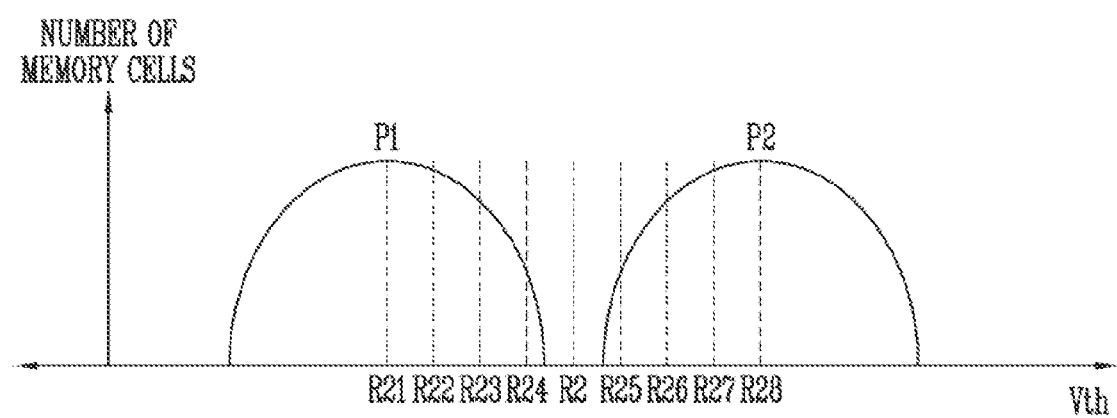
FIG. 13 illustrates relative magnitudes of read voltages shown in FIG. 12.

FIG. 13 illustrates relative magnitudes of the read voltages shown in FIG. 12.

Referring to FIGS. 12 and 13, FIG. 13 illustrates a relative magnitude of the read voltage Vread when the read reclaim operation is performed based on the string number ST_NUM determined by the string determiner (170 shown in FIG. 7) in FIG. 12. In FIG. 13, the voltages R21 to R28 may be voltages for distinguishing the first program state P1 and the second program state P2 from each other.

In an embodiment, the threshold voltage distribution of memory cells may be shifted due to read disturb or retention. Therefore, it is necessary for the read operation to be performed by using a voltage level different from the existing voltage R2, when the read reclaim operation is performed.

Referring to FIG. 12, when the sensing current I_SENSING is out of the error range of the reference current I_REF and is greater than the reference current I_REF, i.e., when the string number ST_NUM has a positive integer value, it may be determined that the threshold voltage distribution has been shifted to the left.

Therefore, the shifting of the threshold voltage distribution is determined based on the string number ST_NUM, and the threshold voltage distribution is further shifted to the left as the string number ST_NUM increases as a positive value. Hence, the read voltage level may be set to become low. That is, the read voltage may become low from the voltage R24 to the voltage R21 as the string number ST_NUM increases as a positive value.

Consequently, when the string number ST_NUM has a positive value, the read operation is performed by using R21 to R24 instead of the voltage R2, so that the red reclaim operation can be performed.

However, when the sensing current I_SENSING is out of the error range of the reference current I_REF and is smaller than the reference current I_REF, i.e., when the string number ST_NUM has a negative integer value, it may be determined that the threshold voltage distribution has been shifted to the right.

Therefore, the shifting of the threshold voltage distribution is determined based on the string number ST_NUM, and the threshold voltage distribution is further shifted to the right as the string number ST_NUM increases as a negative value. Hence, the read voltage level may be set to become high. That is, the read voltage may become high from the voltage R25 to the voltage R28 as the string number ST_NUM increases as a negative value.

Consequently, when the string number ST_NUM has a negative value, the read operation is performed by using R25 to R28 instead of the voltage R2, so that the red reclaim operation can be performed.

Figure 14:
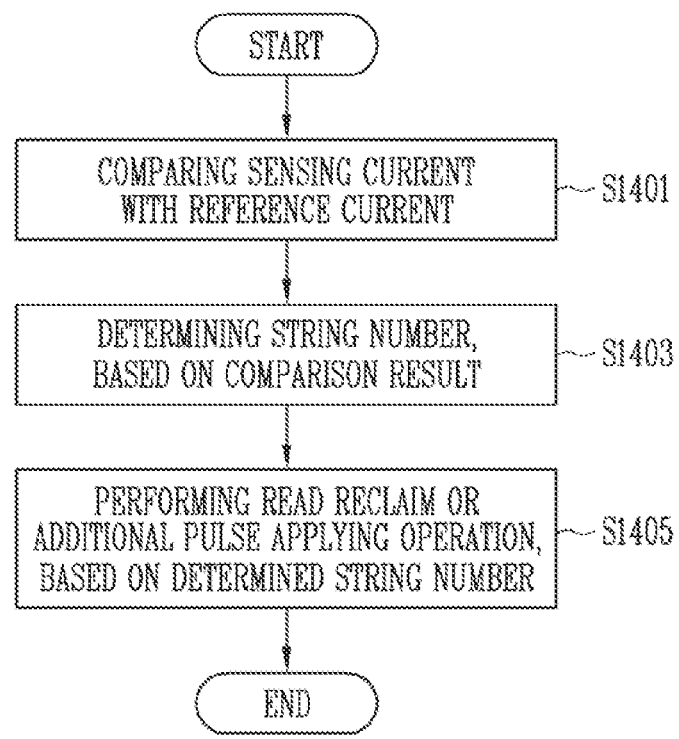
FIG. 14 is a diagram illustrating an operation of the memory device in accordance with an embodiment of the present disclosure.

FIG. 14 is a diagram illustrating an operation of the memory device in accordance with an embodiment of the present disclosure.

Referring to FIG. 14, in step S1401, the memory device may compare a sensing current with a reference current. The sensing current may be a current obtained by sensing a current flowing through a plurality of sensing transistors included in the current sensing unit, and the reference current may be a current predicted based on a number of memory cells predicted to be turned on at a specific read voltage, when a threshold voltage distribution of memory cells is uniform.

In step S1403, the memory device may determine a string number, based on a result obtained by comparing the sensing current with the reference current.

Specifically, the sensing current may be within an error range of the reference current or might not be within the error range of the reference current. The sensing current may be greater or smaller than the reference current within the error range of the reference current. Also, the sensing current may be greater or smaller than the reference current, outside the error range of the reference current.

In an embodiment, the memory device may set the string number as '0,' when the sensing current is within the error range of the reference current.

However, when the sensing current is smaller than the reference current while not being within the error range of the reference current, the memory device may set the string number as a negative integer. The string number may increase as a negative value, as the sensing current becomes smaller than the reference current.

Also, when the sensing current is greater than the reference current while not being within the error range of the reference current, the memory device may set the string number as a positive integer. The string number may increase as a positive value, as the sensing current becomes greater than the reference current.

In step S1405, the memory device may perform a read reclaim or additional pulse applying operation, based on the determined string number.

For example, in an embodiment, when the string number is '0,' i.e., when the sensing current is within the error range of the reference current, the memory device might not perform the read reclaim operation. That is, since the sensing current is within the error range of the reference current, the memory device may perform the additional pulse applying operation of applying an additional pulse to a substrate or a word line, instead of the read reclaim operation performed for a relatively long time.

However, when the string number is not '0,' i.e., when the sensing current is not within the error range of the reference current, the memory device may perform the read reclaim operation.

Figure 15:
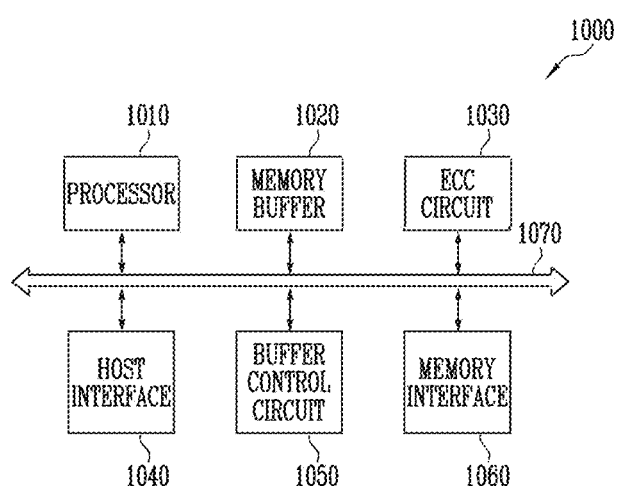
FIG. 15 is a diagram illustrating another embodiment of a memory controller shown in FIG. 1.

FIG. 15 is a diagram illustrating another embodiment of the memory controller shown in FIG. 1.

Referring to FIG. 15, a memory controller 1000 is connected to a host and a memory device. The memory controller 1000 is configured to access the memory device in response to a request received from the host. For example, the memory controller 1000 is configured to control read, program, erase, and background operations of the memory device. The memory controller 1000 is configured to provide an interface between the memory device and the host. The memory controller 1000 is configured to drive firmware for controlling the memory device.

The memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may be configured to provide channels between components of the memory controller 1000.

The processor 1010 may control overall operations of the memory controller 1000, and perform a logical operation. The processor 1010 may communicate with the external host through the host interface 1040, and communicate with the memory device through the memory interface 1060. Also, the processor 1010 may communicate with the memory buffer 1020 through the buffer control circuit 1050. The processor 1010 may control an operation of the storage device, using the memory buffer 1020 as a working memory, a cache memory or a buffer memory.

The processor 1010 may perform a function of a flash translation layer (FTL). The processor 1010 may translate a logical block address LBA provided by the host through the FTL into a physical block address PBA. The FTL may receive a logical block address LBA, using a mapping table, to be translated into a physical block address PBA. Several address mapping methods of the FTL exist according to mapping units. A representative address mapping method includes a page mapping method, a block mapping method, and a hybrid mapping method.

The processor 1010 is configured to randomize data received from the host. For example, the processor 1010 may randomize data received from the host, using a randomizing seed. The randomized data is provided as data to be stored to the memory device and may be programmed in the memory cell array.

The processor 1010 may perform randomizing and derandomizing by driving software or firmware.

The memory buffer 1020 may be used as the working memory, the cache memory, or the buffer memory of the processor 1010. The memory buffer 1020 may store codes and commands, which are executed by the processor 1010. The memory buffer 1020 may store data processed by the processor 1010. The memory buffer 1020 may include a Static RAM (SRAM) or a Dynamic RAM (DRAM).

The ECC circuit 1030 may perform an ECC operation. The ECC circuit 1030 may perform ECC encoding on data to be written in the memory device through the memory interface 1060. The ECC encoded data may be transferred to the memory device through the memory interface 1060. The ECC circuit 1030 may perform ECC decoding on data received from the memory device through the memory interface 1060. For example, the ECC circuit 1030 may be included as a component of the memory interface 1060 in the memory interface 1060.

The host interface 1040 may communicate with the external host under the control of the processor 1010. The host interface 1040 may communicate with the host, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a nonvolatile memory express (NVMe), a Universal Flash Storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

The buffer control circuit 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

For example, the memory controller 1000 might not include the memory buffer 1020 and the buffer control circuit 1050.

For example, the processor 1010 may control an operation of the memory controller 1000 by using codes. The processor 1010 may load codes from a nonvolatile memory device (e.g., a read only memory (ROM)) provided in the memory controller 1000. In another example, the processor 1010 may load codes from the memory device through the memory interface 1060.

For example, the bus 1070 of the memory controller 1000 may be divided into a control bus and a data bus. The data bus may be configured to transmit data in the memory controller 1000, and the control bus may be configured to transmit control information such as a command and an address in the memory controller 1000. The data bus and the control bus are separated from each other, and might not interfere or influence with each other. The data bus may be connected to the host interface 1040, the buffer control circuit 1050, the ECC circuit 1030, and the memory interface 1060. The control bus may be connected to the host interface 1040, the processor 1010, the buffer control circuit 1050, the memory buffer 1020, and the memory interface 1060.

Figure 16:
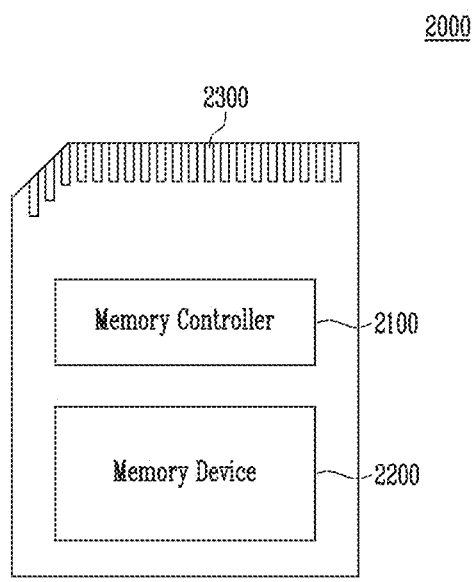
FIG. 16 is a block diagram illustrating a memory card system to which the storage device is applied in accordance with an embodiment of the present disclosure.

FIG. 16 is a block diagram illustrating a memory card system to which the storage device is applied in accordance with an embodiment of the present disclosure.

Referring to FIG. 16, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and a host. The memory controller 2100 is configured to drive firmware for controlling the memory device 2200. The memory device 2200 may be implemented identically to the memory device 100 (100 shown in FIG. 1).

For example, the memory controller 2100 may include components such as a Random Access Memory (RAM), a processing unit, a host interface, a memory interface, and the error corrector.

The memory controller 2100 may communicate with an external device through the connector 2300. The memory controller 2100 may communicate with the external device (e.g., the host) according to a specific communication protocol. For example, the memory controller 2100 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe.

For example, the memory device 2200 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-MRAM).

The memory controller 2100 and the memory device 2200 may be integrated into a single semiconductor device, to constitute a memory card. For example, the memory controller 2100 and the memory device 2200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

In an embodiment, the memory device 2200 may perform background media scan (BGMS). The BGMS may be performed at an idle time at which any command is not received from the memory controller 2100.

In an embodiment, in the BGMS, the memory device 2200 may detect a page having a probability that uncorrectable error correction codes (UECC) of data stored in the page will potentially occur through scanning of the data. The memory device 2200 does not output any pass/fail signal but may detect a page having a probability that UECC will occur through only sensing of a current.

Specifically, the memory device 2200 may detect a page having a probability that UECC will occur, based on a result obtained by comparing a reference current with a sensing current. The reference current may mean a current predicted to be sensed by applying a specific read voltage to a selected word line and applying a sensing node voltage of a page buffer to each gate of a plurality of transistors configured separately, and the sensing current may mean a current sensed actually.

In an embodiment, the memory device 2200 may determine a string number, based on the result obtained by comparing the reference current with the sensing current. For example, when the sensing current is within an error range of the reference current, the string number may be determined as '0.' However, when the sensing current is not within the error range of the reference current, the string number may be determined as a number of strings connected to additionally turned-on memory cells as compared with memory cells predicted to be turned on or a number of strings connected to turned-on memory cells of which number is smaller than that of the memory cells predicted to be turned on.

In an embodiment, when the string number is determined, the memory device 2200 may perform an operation according to the string number. For example, when the string number is '0,' the memory device 2200 may perform an additional pulse applying operation of applying an additional pulse to a selected word line or a substrate. However, when the string number is not '0,' the memory device 2200 may perform a read reclaim operation by using a read voltage level determined according to the string number.

Figure 17:
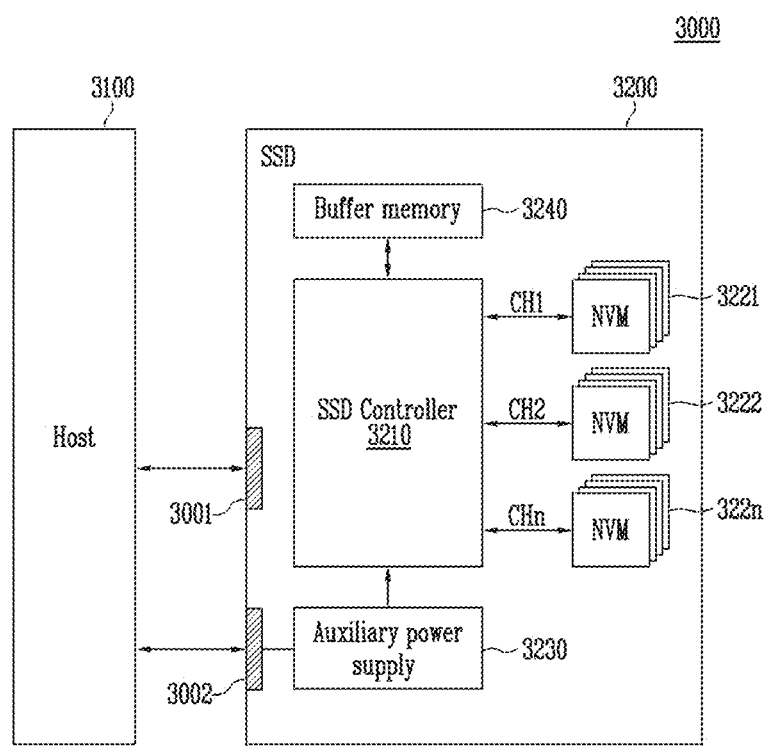
FIG. 17 is a block diagram illustrating a Solid State Drive (SSD) system to which the storage device is applied in accordance with an embodiment of the present disclosure.

FIG. 17 is a block diagram illustrating a Solid State Drive (SSD) system to which the storage device is applied in accordance with an embodiment of the present disclosure.

Referring to FIG. 17, the SSD system 3000 includes a host 3100 and an SSD 3200. The SSD 3200 exchanges a signal SIG with the host 3100 through a signal connector 3001, and receives power PWR through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may serve as the memory controller (200 shown in FIG. 1).

The SSD controller 3210 may control the plurality of flash memories 3221 to 322n in response to a signal SIG received from the host 3100. For example, the signal SIG may be a signal based on an interface between the host 3100 and the SSD 3200. For example, the signal SIG may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 is connected to the host 3100 through the power connector 3002. The auxiliary power supply 3230 may receive power PWR input from the host 3100 and charge the power PWR. When the supply of power from the host 3100 is not smooth, the auxiliary power supply 3230 may provide power of the SSD 3200. For example, the auxiliary power supply 3230 may be located in the SSD 3200, or be located at the outside of the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

In an embodiment, the plurality of flash memories 3221 to 322n may perform background media scan (BGMS). The BGMS may be performed at an idle time at which any command is not received from the SSD controller 3210.

In an embodiment, in the BGMS, the plurality of flash memories 3221 to 322n may detect a page having a probability that uncorrectable error correction codes (UECC) of data stored in the page will potentially occur through scanning of the data. The plurality of flash memories 3221 to 322n do not output any pass/fail signal but may detect a page having a probability that UECC will occur through only sensing of a current.

Specifically, the plurality of flash memories 3221 to 322n may detect a page having a probability that UECC will occur, based on a result obtained by comparing a reference current with a sensing current. The reference current may mean a current predicted to be sensed by applying a specific read voltage to a selected word line and applying a sensing node voltage of a page buffer to each gate of a plurality of transistors configured separately, and the sensing current may mean a current sensed actually.

In an embodiment, the plurality of flash memories 3221 to 322n may determine a string number, based on the result obtained by comparing the reference current with the sensing current. For example, when the sensing current is within an error range of the reference current, the string number may be determined as '0.' However, when the sensing current is not within the error range of the reference current, the string number may be determined as a number of strings connected to additionally turned-on memory cells as compared with memory cells predicted to be turned on or a number of strings connected to turned-on memory cells of which number is smaller than that of the memory cells predicted to be turned on.

In an embodiment, when the string number is determined, the plurality of flash memories 3221 to 322n may perform an operation according to the string number. For example, when the string number is '0,' the plurality of flash memories 3221 to 322n may perform an additional pulse applying operation of applying an additional pulse to a selected word line or a substrate. However, when the string number is not '0,' the plurality of flash memories 3221 to 322n may perform a read reclaim operation by using a read voltage level determined according to the string number.

Figure 18:
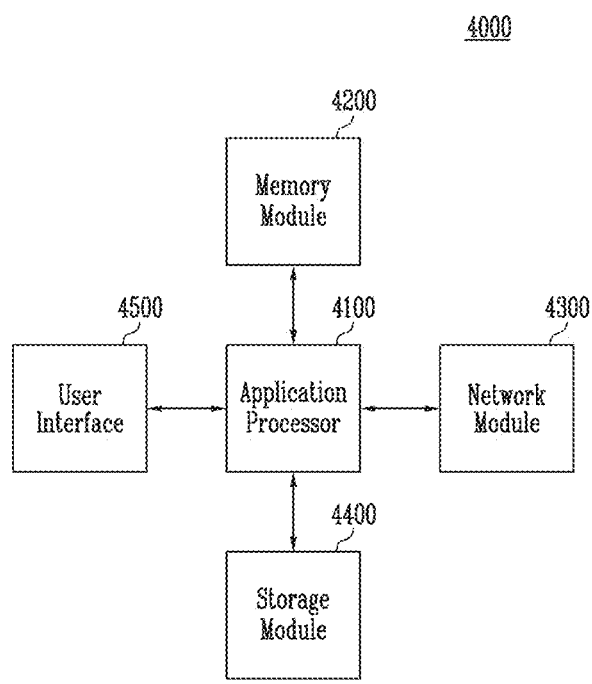
FIG. 18 is a block diagram illustrating a user system to which the storage device is applied in accordance with an embodiment of the present disclosure.

FIG. 18 is a block diagram illustrating a user system to which the storage device is applied in accordance with an embodiment of the present disclosure.

Referring to FIG. 18, the user system 4000 includes an application processor 4100, a memory module 4200, a network module 4300, a storage module 4400, and a user interface 4500.

The application processor 4100 may drive components included in the user system 4000, an operating system (OS), a user program, or the like. For example, the application processor 4100 may include controllers for controlling components included in the user system 4000, interfaces, a graphic engine, and the like. The application processor 4100 may be provided as a System-on-Chip (SoC).

The memory module 4200 may operate as a main memory, working memory, buffer memory or cache memory of the user system 4000. The memory module 4200 may include volatile random access memories such as a DRAM, an SDRAM, a DDR SDRAM, a DDR2 SDRM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. For example, the application processor 4100 and the memory module 4200 may be provided as one semiconductor package by being packaged based on a Package on Package (PoP).

The network module 4300 may communicate with external devices. For example, the network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. For example, the network module 4300 may be included in the application processor 4100.

The storage module 4400 may store data. For example, the storage module 4400 may store data received from the application processor 4100. Alternatively, the storage module 4400 may transmit data stored therein to the application processor 4100. For example, the storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. For example, the storage module 4400 may be provided as a removable drive such as a memory card of the user system 4000 or an external drive.

For example, the storage module 4400 may include a plurality of nonvolatile memory devices, and the plurality of nonvolatile memory devices may operate identically to the memory device described with reference to FIGS. 2 and 3. The storage module 4400 may operate identically to the storage device 50 described with reference to FIG. 1.

The user interface 4500 may include interfaces for inputting data or commands to the application processor 4100 or outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

In an embodiment, the storage module 4400 may perform background media scan (BGMS). The BGMS may be performed at an idle time at which any command is not received from the application processor 4100.

In an embodiment, in the BGMS, the storage module 4400 may detect a page having a probability that uncorrectable error correction codes (UECC) of data stored in the page will potentially occur through scanning of the data. The storage module 4400 does not output any pass/fail signal but may detect a page having a probability that UECC will occur through only sensing of a current.

Specifically, the storage module 4400 may detect a page having a probability that UECC will occur, based on a result obtained by comparing a reference current with a sensing current. The reference current may mean a current predicted to be sensed by applying a specific read voltage to a selected word line and applying a sensing node voltage of a page buffer to each gate of a plurality of transistors configured separately, and the sensing current may mean a current sensed actually.

In an embodiment, the storage module 4400 may determine a string number, based on the result obtained by comparing the reference current with the sensing current. For example, when the sensing current is within an error range of the reference current, the string number may be determined as '0.' However, when the sensing current is not within the error range of the reference current, the string number may be determined as a number of strings connected to additionally turned-on memories as compared with memory cells predicted to be turned on or a number of strings connected to turned-on memory cells of which number is smaller than that of the memory cells predicted to be turned on.

In an embodiment, when the string number is determined, the storage module 4400 may perform an operation according to the string number. For example, when the string number is '0,' the storage module 4400 may perform an additional pulse applying operation of applying an additional pulse to a selected word line or a substrate. However, when the string number is not '0,' the storage module 4400 may perform a read reclaim operation by using a read voltage level determined according to the string number.

In accordance with the present disclosure, a page having a probability that UECC will occur is selected by comparing a reference current with a sensing current, and a read reclaim or additional pulse applying operation on the corresponding page is performed, so that the reliability of data can be improved.

While the present disclosure has been shown and described with reference to certain examples of embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described examples of embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the examples of embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A method for operating a memory device including a plurality of pages each configured with a plurality of memory cells, the method comprising:

performing a background media scan on a selected page among the plurality of pages at an idle time at which no command is received from a memory controller;

sensing a current flowing through a plurality of transistors respectively coupled between a plurality of page buffers coupled to the plurality of pages through a plurality of bit lines and memory cells of the selected page, in the background media scan;

determining a string number, based on a result obtained by comparing a sensing current obtained by sensing a current flowing through the plurality of transistors with a reference current; and performing one of a read reclaim operation and an additional pulse applying operation on a memory block including the selected page according to the string number, wherein, in the performing one of the read reclaim and additional pulse applying operation, the read reclaim operation is performed according to the string number, when the sensing current is out of an error range of the reference current, and wherein, when the string number is a negative integer, the read reclaim operation is performed by using a level higher than a read voltage level in the background media scan.

2. The method of claim 1, wherein, in the sensing of the current flowing through the plurality of transistors, the current is sensed by applying each of voltages of sensing nodes included in the plurality of page buffers to each of gates of the plurality of transistors respectively.

3. The method of claim 1, wherein, in the performing one of the read reclaim operation and additional pulse applying operation, the additional pulse applying operation is performed based on the sensing current, when the sensing current is within an error range of the reference current.

4. The method of claim 3, wherein, when the sensing current is greater than the reference current, a pulse voltage is applied to a word line connecting the memory cells included in the selected page.

5. The method of claim 3, wherein, when the sensing current is smaller than the reference current, a pulse voltage is applied to a substrate of the selected page.

6. The method of claim 1, wherein, when the string number is a positive integer, the read reclaim operation is performed by using a level lower than a read voltage level in the background media scan.

* * * * *